Sept. 12, 1967 J. O. KESSLER 3,341,821

ADAPTIVE SEMICONDUCTOR DEVICE

Original Filed Nov. 28, 1962 5 Sheets-Sheet 1

INVENTOR.
JOHN O. KESSLER

INVENTOR.
JOHN O. KESSLER

INVENTOR.
JOHN O. KESSLER

INVENTOR.
JOHN O. KESSLER

Sept. 12, 1967 J. O. KESSLER 3,341,821

ADAPTIVE SEMICONDUCTOR DEVICE

Original Filed Nov. 28, 1962 5 Sheets-Sheet 5

INVENTOR.
JOHN O. KESSLER

United States Patent Office 3,341,821

Patented Sept. 12, 1967

3,341,821

ADAPTIVE SEMICONDUCTOR DEVICE

John O. Kessler, Princeton, N.J., assignor to Radio Corporation of America, a corporation of Delaware Original application Nov. 28, 1962, Ser. No. 240,600, now Patent No. 3,264,532, dated Aug. 2, 1966. Divided and this application Oct. 30, 1964, Ser. No. 407,801
17 Claims. (Cl. 340—172.5)

ABSTRACT OF THE DISCLOSURE

This invention relates to an adaptive semiconductor device consisting of N-type, P-type, and junction regions, which exhibits ordinary current and voltage characteristics of a rectifier but which can be adaptively modified to exhibit resistive voltage and current characteristics upon the application of heat, radient energy or electrical energy. The adaptation process may be stopped at any point and upon cooling the device retains its adapted characteristics. Proper application of additional heat and voltage will reverse the adaptation and return the device to its original state.

This is a division of pending application, Ser. No. 240,-600, filed Nov. 28, 1962 now Patent No. 3,264,532, granted Aug. 2, 1966.

This invention relates to an adaptive semiconductor device and to methods of making the device. The invention includes also apparatus and methods for using the novel device.

Conventional semiconductor devices are circuit elements which are reasonably constant in their structure and characteristics toward changes in ambient conditions and toward electrical signals applied to or passing through them in the course of their intended use. Adaptive semiconductor devices are circuit elements whose structure and characteristics undergo controlled changes in response to particular ambient conditions and/or electrical signals applied to or passing through them, and remain reasonably constant with respect to other influences.

An object of this invention is to provide a novel adaptive semiconductor device.

Another object is to provide novel methods for preparing the novel device.

A further object is to provide novel methods and apparatus for using the novel device.

It is a still further object of the present invention to provide improved systems, circuits and networks which can be made to adapt or change their characteristics under certain conditions, such as electrical, thermal, or radiation conditions, and which retain their adapted characteristics after the conditions which influenced their adaption cease to exist.

The device of the invention, described in a general way, comprises a body of semiconductor material including an N-type region, a P-type region, and a junction region separating the N-type and P-type regions. One or both of the N-type and P-type regions contain inclusions, as separate phases, of the elemental form of a relatively mobile conductivity-type-determining impurity. The junction region includes nucleation centers for producing, as by precipitation, the inclusions in the junction regions.

A preferred embodiment comprises a germanium body having a P-type region doped predominantly with a relatively immobile P-type impurity for germanium, and an N-type region doped predominantly with lithium, which is a relatively mobile N-type impurity for germanium. There are inclusions of elemental lithium distributed in the N-type region, especially adjacent the junction region. This device exhibits the ordinary I-V (current-voltage) characteristic of a rectifier; that is, it passes a high current when biased in the forward direction, and passes a low current when biased in the backward direction. Unlike previous rectifiers, the I-V characteristic can be controllably and reversibly modified; that is, it can be adapted.

The adaption can be achieved by heating the device to between 100 and 300° C. and simultaneously applying a voltage to the device in the backward direction of current flow. The heat, which may be applied from an external source, or may be generated internally, increases the mobility of the relatively mobile impurity. The voltage produces an electric field in the body which causes the inclusions to migrate into the junction, producing leakage paths through the junction, and thereby reduces the ratio of forward current to back current. The adaption process may be stopped at any point in time and, upon cooling to room temperature, the device will retain its now adapted characteristics. The device may be readapted by again heating and applying a voltage so as to cause the inclusions to migrate. The adaption process may be reversed to return to the initial I-V characteristic by heating the device as described and applying a voltage in the forward direction of current flow in the device. Such direction of current flow causes the inclusions to migrate out of the junction and thereby increases the ratio of forward current to back current.

The invention includes also methods for preparing the device of the invention including, generally, producing in a semiconductor body a first region of one conductivity type separated from a second region of the other conductivity type by a junction region. By the process of the invention, inclusions of the elemental form of relatively mobile impurities of the one conductivity type are produced in the first region, and nucleation centers for producing said inclusions are produced in the junction region.

Also, in accordance with the invention, systems, networks and circuits are provided which include one or more semiconductor devices of the type herein described. Means are provided for changing the operating characteristics of these systems, networks, and circuits to adapt them for changes in external conditions or to respond in a predetermined manner to different input stimuli. The adapting means may include the semiconductor devices and means for changing their electrical characteristics. The terms adaption circuit, adaption network, or adaption system are used herein to define systems, networks and circuits embodying the invention which can have different operating characteristics under different conditions.

A more detailed description of the invention and illustrative embodiments thereof appear below in conjunction with the drawings in which:

FIGURE 1 includes also a circuit for adapting the device and a circuit for using the device.

Figure 3:
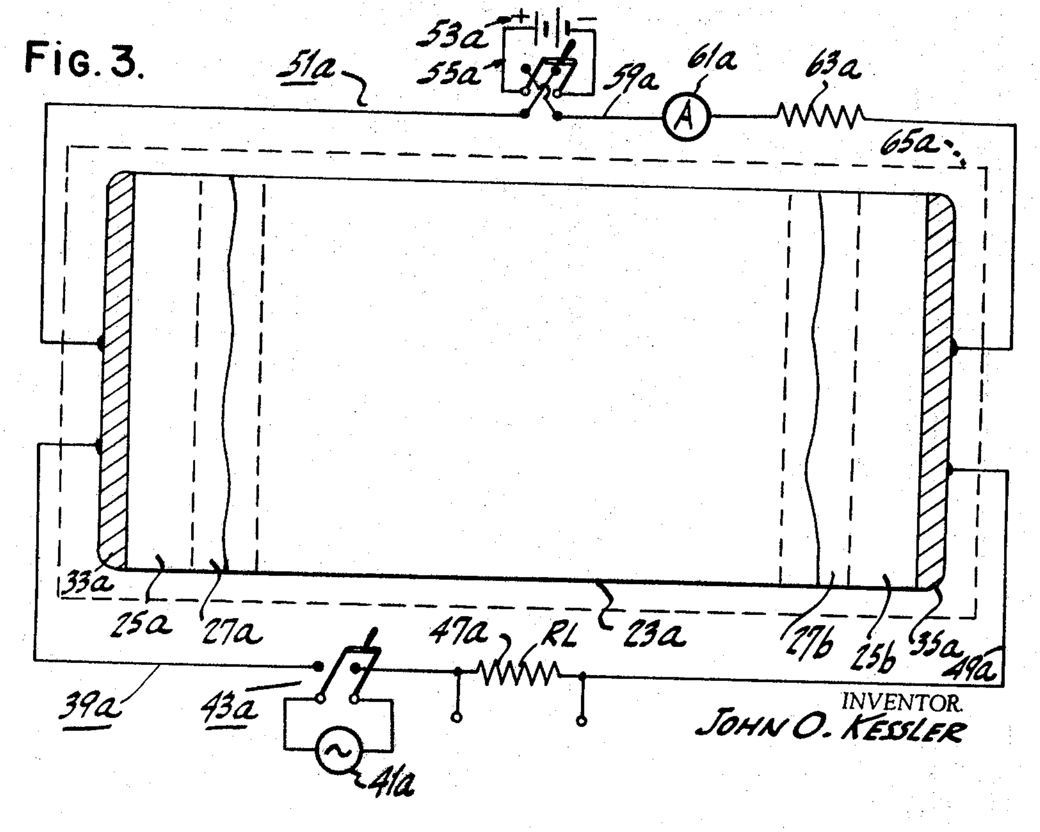

FIGURE 3 includes a sectional view of a second embodiment of the invention having two junctions.

Figure 4:
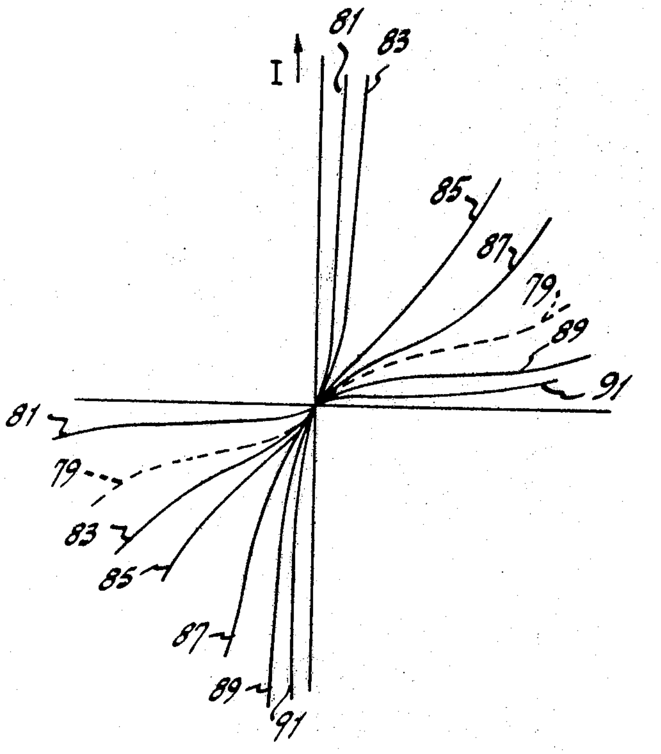

FIGURE 4 is a family of curves illustrating the I-V characteristic of the device of FIGURE 3 in various conditions of adaption and in the virgin condition.

Figures 5, 6, 7, 8, 9, 10:
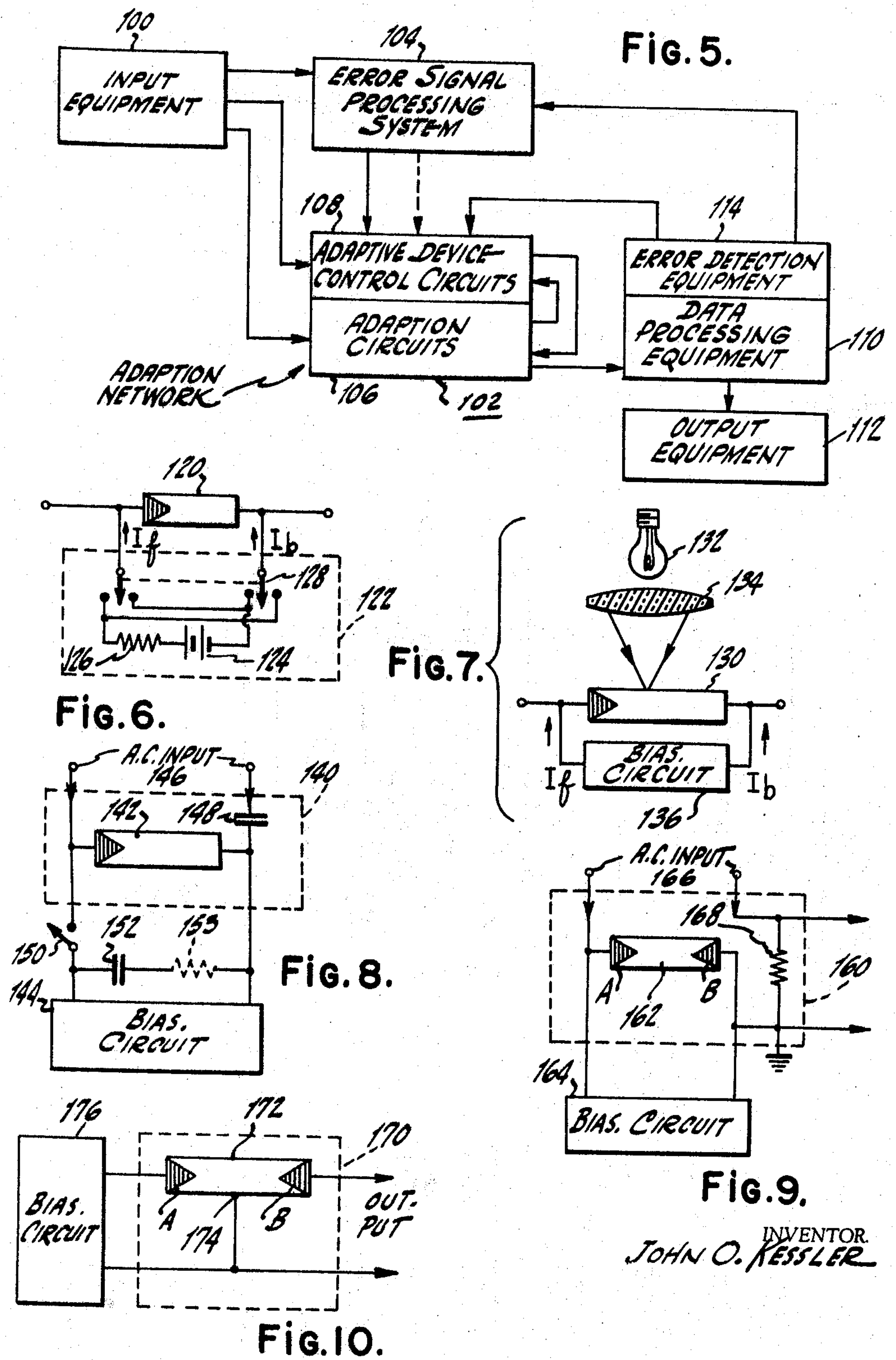

FIGURE 5 is a block diagram of an information processing system embodying the invention.

FIGURES 6 to 11, in inclusive, are circuit diagrams, some partially in block form, which schematically show different networks and circuits, all embodying the invention.

Figures 12, 14, 15, 16:
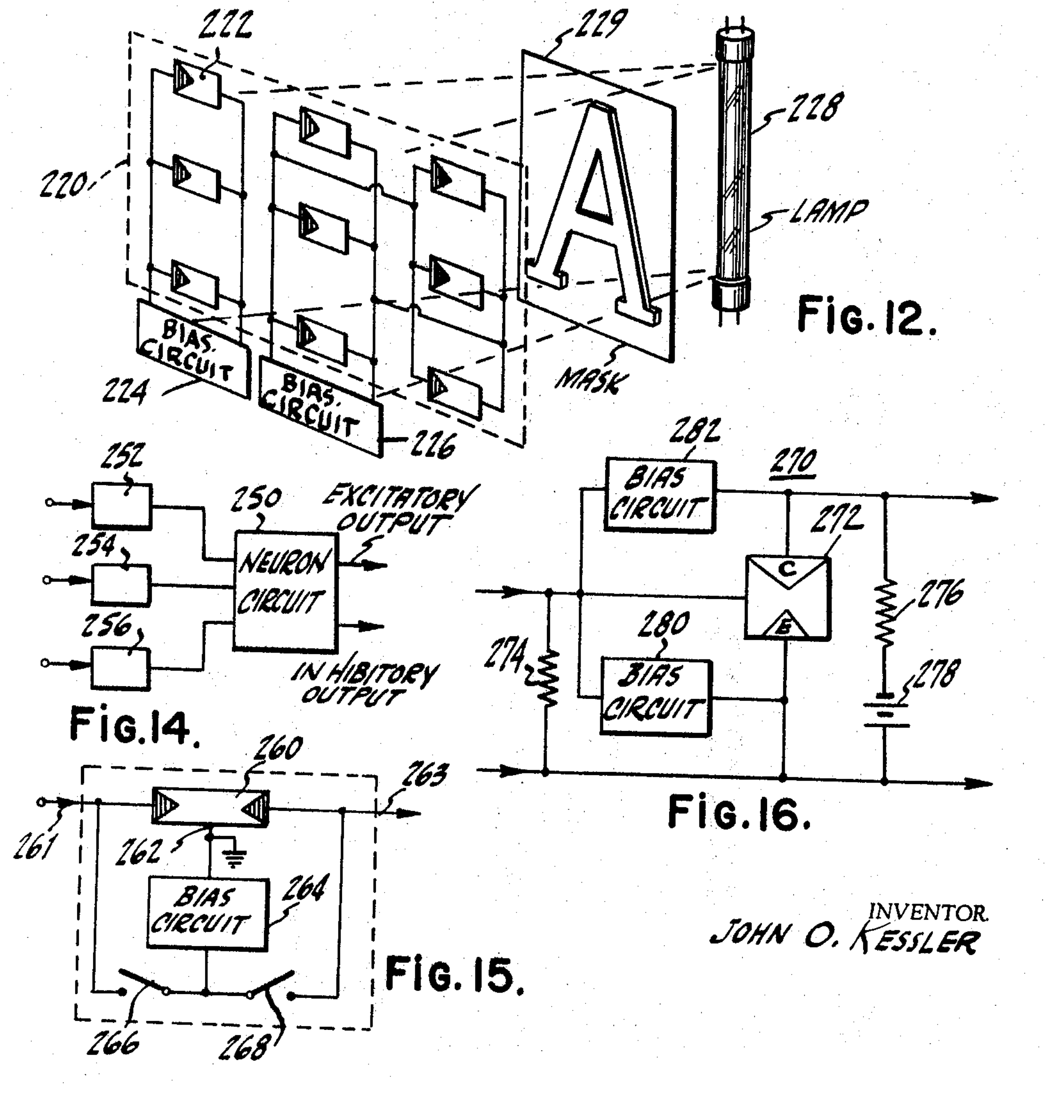

FIGURE 12 is a diagram schematically illustrating, in part, a pattern recognition system embodying the invention.

Figure 13:
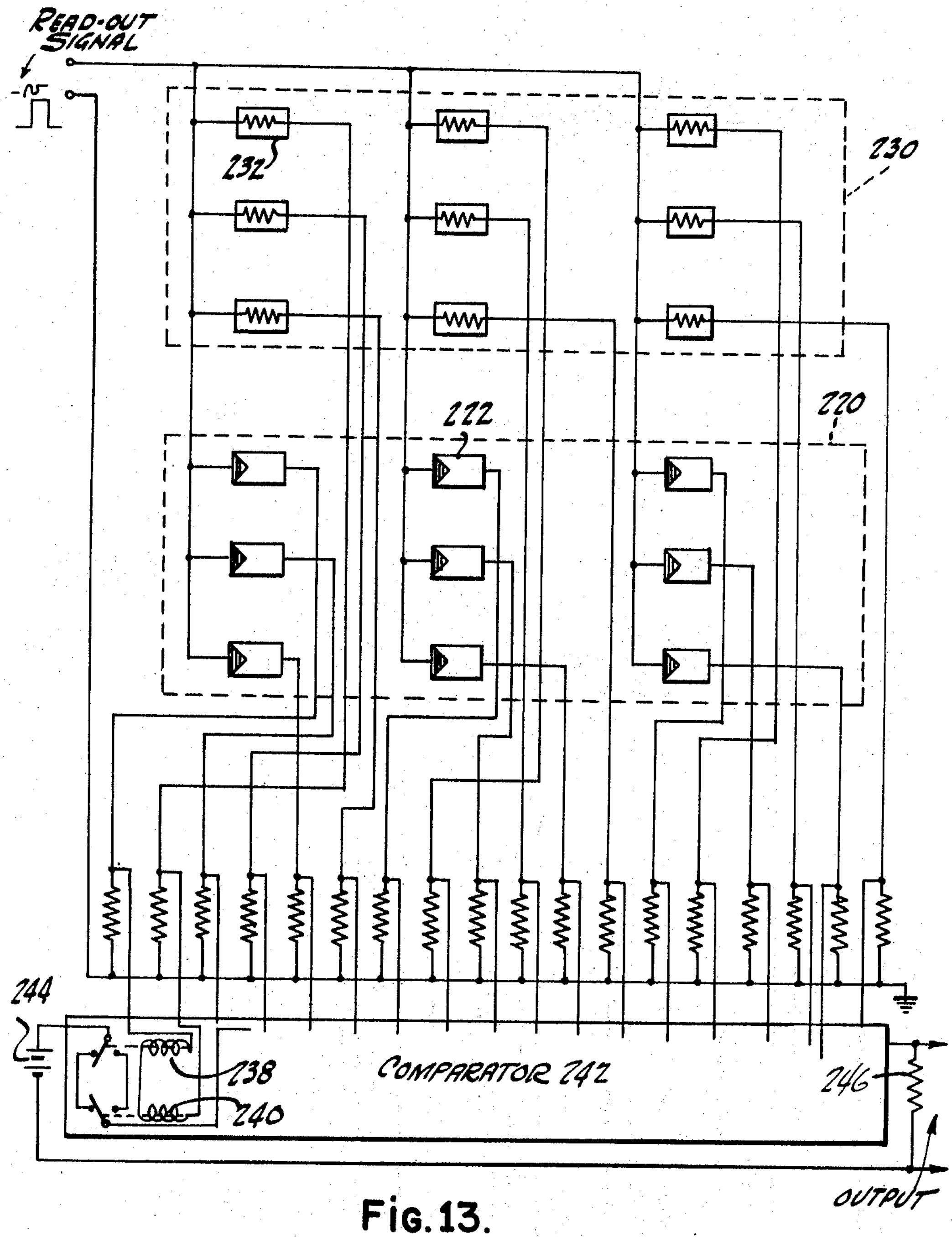

FIGURE 13 is a schematic diagram illustrating other parts of the character recognition circuits systems which is shown in FIGURE 12.

FIGURE 14 is a block diagram of a portion of a neural system embodying the invention.

FIGURE 15 is a schematic diagram of a circuit used in the system of FIGURE 14.

FIGURE 16 is a circuit diagram of an amplifier embodying the invention.

Similar reference numerals are used for similar elements throughout the drawing.

Figure 1:
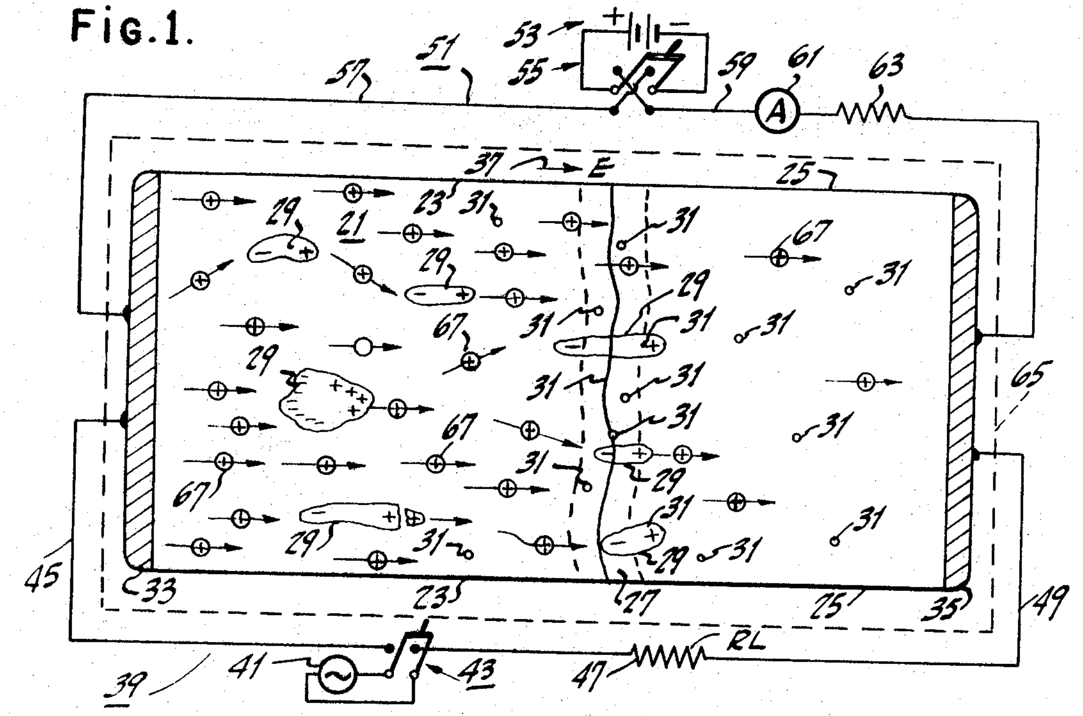
FIGURE 1 is a sectional view of a first embodiment of a device of the invention having a single junction.

FIGURE 1 illustrates a first embodiment of a device 21 of the invention having a single junction region. The device 21 comprises a semiconductor body having a first region 23 of one conductivity type and a second region 25 of the opposite conductivity type. A junction region 27 separates the first region 23 from the second region 25. There are inclusions 29, as separate phases, in the first region 23; and there are nucleation centers 31 for producing such inclusions in the junction region 27 under conditions which are described below. The inclusions are composed of the elemental form of a relatively mobile impurity which produces the one conductivity type in the particular semiconductor comprising the body. By inclusions is meant a mass of material, as separate phases from, though completely surrounded by, the semiconductor. The inclusions may, for example, be material that precipitates upon cooling a semiconductor which is saturated with the impurity. In the ordinary doped semiconductor, the impurity does not saturate the semiconductor and is not present as a separate phase from the semiconductor. There are some nucleation centers 31 of the type described also in the first region 23 and in the second region 25. The device is completed by a first and a second electrode 33 and 35 attached to the first region 23 and the second region 25, respectively.

The semiconductor body may be of any semiconductor material such as silicon, gallium arsenide, indium antimonide or cadmium sulfide; but it is preferably of germanium. The body is preferably a single crystal, but may be polycrystalline; and may be in any geometrical shape, such as a massive body or a thin film. The first region 23 may be either of N-type or P-type conductivity, and the inclusions 29 therein are of an element which produces the same conductivity type in the semiconductor material.

For illustrative purposes, the device 21 of FIGURE 1 is, hereafter considered, comprised of a single crystal body of germanium. The first region 23 is N-type germanium, and the inclusions 29 are elemental lithium, which is both N-type in germanium and relatively mobile at temperatures just above room temperature. The second region 25 is P-type germanium and is also part of the same single crystal. The ohmic electrodes 33 and 35 may be of any material used for this purpose in the art.

Figure 2:
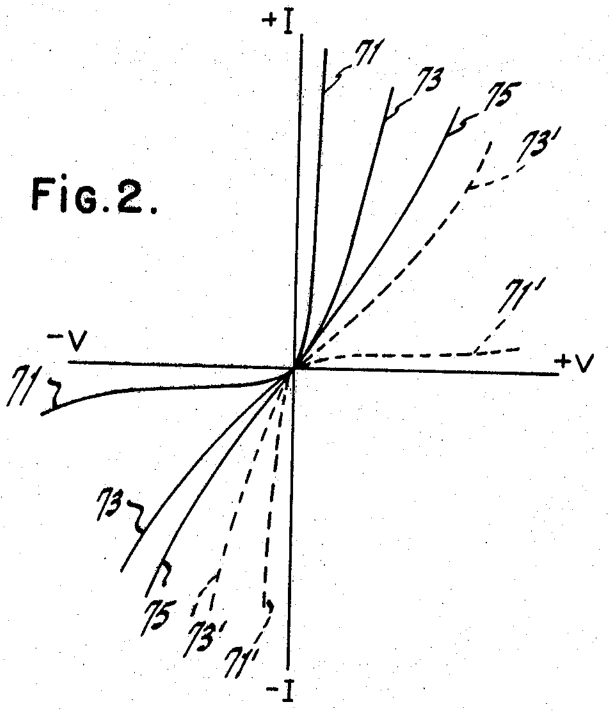
FIGURE 2 is a family of curves illustrating the I-V characteristic of the device of FIGURE 1 in various conditions of adaption.

FIGURE 1 shows also a utilization circuit 39. The utilization circuit shown is for rectifying alternating current (AC) from an AC source 41. The AC source 41 is connected through a double-pole, single-throw switch 43 to the first ohmic electrode 33 by a lead 45; and to the second ohmic electrode 35 through a load 47 by a lead 49. The load 47 may, for example, be a direct current motor, the speed of which is controlled by changing the characteristics of the device 21 so that it passes more or less direct current. With the switch 43 closed, the device 21 rectifies the AC from the AC source 41 in the usual way. the I-V (current-voltage) characteristic of the device 21 in this condition is a rectifying or unidirectional conductivity characteristic as shown by the curve 71 of FIGURE 2.

The I-V characteristic may be adapted by means of the adaption circuit 51 shown in FIGURE 1. The adaption circuit 51 comprises a direct current (DC) source 53, such as a battery, connected to a double-pole, double-throw reversing switch 55. A lead 57 connects one pole of the switch 55 to the first ohmic electrode 33. Another lead 59 connects the other pole of the switch 55 to the other second ohmic electrode 35 through an ammeter 61 and a current limiting resistor 63. The device 21 is contained in a temperature controlled ambient 65, which is shown schematically by a dotted rectangle in FIGURE 1. The controlled ambient 65 may be a liquid or powder in a container in which the device 21 is immersed, or it may be a gas in a chamber circulated about the device 21 or it may be simply thermal insulation about the device 21 for reducing the heat loss from internally generated heat, or it may be a thermal conductor for increasing the heat loss from the device. In any case, the controlled ambient 65 provides and/or maintains the device 21 at the temperature desired for adaption. For illustrative purposes, the means 65 is a container holding a silicone oil at the desired temperature.

Whenever adaption is desired in the particular example of FIGURE 1, the switch 43 is opened. Then the device is brought to the adaption temperature and the switch 55 is closed so as to provide a DC bias voltage to the device 21 in one or the other direction of current flow, e.g., the backward direction. As viewed in FIGURE 1, the switch 55 is closed downward so that the first ohmic electrode 33 is positive and the second ohmic electrode 35 is negative. The temperature of the device 21 is maintained between 50° C. and 150° C. in our example. Other temperature ranges may apply where other semiconductors are used as the body and other materials are used for the inclusions 29. After a short period of time, the switch 55 is opened and the device 21 is cooled. On examination, the device 21 exhibits a resistive or bidirectional I-V characteristic as shown by the curve 73. If the time period were longer or if the applied voltage higher, the device would have a resistive I-V characteristic as shown by the curve 75. Optionally, the device 21 adapted to have the characteristic illustrated in the curve 73 may be further adapted in a separate adaption step to reach the condition of the curve 75. The device 21 may thus be changed in I-V characteristic from the rectifying characteristic of curve 71 to the resistive characteristic of curve 75 or to any intermediate resistive characteristic by a proper selection of conditions, such as applied voltage, ambient temperature, and adaption time.

This adaption is reversible; that is, the I-V characteristic may be changed back to some previous I-V characteristic. This reversal may be achieved in the same manner as just described, except that the double-throw switch 55 is reversed, so that the first ohmic contact 33 is negative and the second ohmic contact 35 is positive. Thus, the characteristics of the device 21 may be electronically changed from any characteristic between curves 71 and 75 to any other characteristic in this range. Furthermore, the I-V characteristics of the device may be changed as many times as desired. The dotted curves 71' and 73' show the position of the I-V curves 71 and 73 when the ohmic contacts 33 and 35 are reversed in the utilization circuit 39.

The changes in the structure of the device 21 during adaption may be explained by reference to FIGURE 1 and the following theory. The N-type region 23 contains lithium ions 67, lithium metal precipitates 29, and nucleation centers 31 for precipitating lithium. When the device 21 is heated to between 50 and 150° C., the mobility of the lithium ions 67 increases significantly. When a voltage is applied in the back direction of current flow, a field E shown by the arrow 37 is produced across the device 21. The field E acts on the mobile lithium ions 67 in the first region 23 causing them to drift toward and into the junction region 27. The positive charges on lithium ions 67 which collide with lithium metal inclusions 29, are neutralized and lithium deposits in the elemental form. Lithium metal atoms at the opposite end of the inclusion 29 become positively charged and leave the inclusion 29. Thus, the effect of the field E is to build up the inclusion on one side and to dissolve the inclusion on the opposite side. The inclusions build up in a needle-shape by virtue of the electric field E present in the body, and boundary conditions at the inclusion-semiconductor interface. By these processes, needle-shaped inclusions build up in the direction opposite to that of the field E. The buildup can take place either toward or away from the junction region 27, and is determined by the direction of the field E. New inclusions of elemental lithium are also produced by starting at nucleation centers 31 by a proper coincidence of conditions.

The building up or dissolving of needle-shaped inclusions 29 in the junction region 27 changes the I-V characteristics of the device 21. When the inclusions build up in the junction region 27, they provide current paths which bridge the junction region 27, thereby reducing the ratio of forward to back current. This shifts the I-V characteristic toward curve 75 of FIGURE 2. On the other hand, when inclusions dissolve out of the junction region 27, the ratio of forward to back current is increased, shifting the I-V characteristic toward the curve 71 of FIGURE 2. Whatever the correct theoretical explanation, the operation of the device is as described.

FIGURE 3 illustrates a second embodiment of the invention. The embodiment is similar to that of FIGURE 1 except that there are two junction regions *27a* and *27b*, and three conductivity regions *25a*, *23a* and *25b* as viewed from left to right in FIGURE 3. The conductivity regions alternate in type, either P-N-P or N-P-N. For illustrative purposes, the device *21a* is considered to be P-N-P, made of germanium, wherein the N region contains lithium ions and inclusions of elemental lithium. The first and second electrodes *33a* and *35a* contact the end P-type regions *25a* and *25b*, respectively. The utilization circuit *39a* and the adaption circuit 51 are the same in structure and operation as those illustrated in FIGURE 1.

FIGURE 4 illustrates a typical family of I-V curves obtained with the device *21a* of FIGURE 3. In the condition described in the foregoing paragraph, the device *21a* is essentially two rectifiers connected back to back. In one state, the device exhibits the approximately ohmic characteristic shown by the curve 85. As the device *21a* is adapted in one direction of applied field E, the I-V characteristic shifts progressively toward the curve 81, in which condition one junction region is completely cleared of inclusions, while the other is shorted out by the inclusions. On applying a field E in the opposite direction during adaption, the I-V characteristic shifts toward the curve 91, in which condition the other junction is now cleared of inclusions and the first junction is shorted out by inclusions. The adaption may be repeated and reversed as many times as desired and one may adapt the device to any condition between and including the curves 81 and 91.

The devices of the invention may include three or more junctions according to the principles set forth above with respect to one and two junction devices. The multiple junction devices may have two or more junctions in parallel with one another, which may also be in series with one or more other junctions. The junctions may be positioned with respect to one another so as to interact, for example, to provide transistor-like action.

The devices 21 and *21a* may be fabricated by any of the processes used for producing junction devices. In this process, one of the conductivity type regions is deliberately fabricated to contain inclusions of the elemental form of a relatively-mobile conductivity-type-determining impurity. This is achieved generally by dissolving the impurity in high enough concentration and at high enough temperatures such that the elemental form of the impurity precipitates upon cooling. There are phase diagrams for many systems which describe the concentrations and temperature differences which produce the desired precipitation.

Also, in this process, the one conductivity-type region is deliberately fabricated to contain nucleation centers for precipitating the desired inclusions. While some nucleation centers are normally formed by the previous fabrication processes, the more desirable steps for producing inclusions produce a more desirable density and distribution of nucleation centers for the purposes of adaption.

In the processes of making the devices, a step of annealing or forming may be employed, which has the effect of establishing the device characteristics, usually by producing at least one junction adjacent the region having inclusions therein.

There now follow several examples of particular procedures for making particular devices of the invention.

*Example 1.*—Start with a P-type rectangular single crystal wafer of germanium having a resistivity between 0.1 ohm-cm. and 5 ohm-cm. at room temperature. The wafer is about 0.5 x 0.5 x 0.01 cm. in size. Place the wafer in a dry mixture consisting essentially of equal parts of lithium chloride and lithium hydroxide in a quartz crucible. Heat the crucible and mixture at about 615° C. in flowing hydrogen for about 5 minutes. This heating melts the dry mixture and lithium ions diffuse into the germanium. The mass is then cooled to room temperature. In cooling, the damage resulting from the difference in coefficients of expansion between the wafer and the fused material acts as a source of nucleation centers. The wafer is removed from the solidified melt and is now lightly etched in dilute acid to remove the surface layer of disturbed material. Next, the wafers, which are now N-type, are annealed in flowing hydrogen gas at about 200° C. to 300° C. for about an hour to produce a thin P-type skin on the N-type wafer. The wafers are again lightly etched and ohmic contacts in the form of solder dots are applied to opposite surfaces of the wafer. The wafers are again etched to complete the device.

*Example 2.*—Follow the procedure of Example 1 except substitute helium for hydrogen in the heating and annealing steps.

*Example 3.*—Start with a P-type rectangular single crystal wafer of germanium, having a resistivity between 0.1 ohm-cm. and 5 ohm-cm. at room temperature. The wafer is about 0.5 x 0.5 x 0.01 cm. in size. Place the wafer in a dry mixture consisting essentially of equal parts of lithium chloride and lithium hydroxide in a quartz crucible. Heat the crucible and mixture at about 615° C. in flowing hydrogen for about 5 minutes. This heating melts the dry mixture and lithium ions diffuse into the germanium. The mass is then cooled to 200° C. and maintained in the same ambient at that temperature, for about ten hours or longer. After this annealing treatment, the mass is cooled to room temperature and the wafer is removed from the fused material. The wafer is then washed and lightly etched, solder dots are applied, and the wafer is heavily etched in such a way that the P-type surface layer produced in the annealing treatment is removed everywhere except under the solder dots. This etching treatment can also be applied to the wafers fabricated as in Examples 1 and 2. This etching treatment yields devices with high ultimate rectification ratios than the treatment previously described. Wires are then attached to the solder dots and the device is given a cleaning by washing in water, etching in an acid bath and then washing in alcohol so as to remove any debris remaining from the process.

*Example 4.*—Start with an intrinsic (30 ohm-cm. at room temperature) single crystal wafer of germanium having dimensions 0.2 x 0.2 x 0.2 cm. The dimensions in this or any of the other examples are not crucial. They do not bear directly on the fundamental operation of the device. They do however affect its quantitative behaviour, for instance, with respect to ease of adapting from one condition to another, or with respect to the ultimate frequency response. Place the wafer with a dry mixture consisting of essentially equal parts by weight of lithium hydroxide and lithium chloride, in a cylindrical container made of commercial high purity graphite. Place the container into a resistance furnace. Heat the mixture to 620° C. for three minutes in flowing dry hydrogen gas. Then, lower the temperature of the container to room temperature. Remove the wafer (now N-type, doped with lithium) from the fused mass and graphite container. Clean the wafer by washing in dilute nitric acid, water, alcohol, and a conventional germanium etch (for instance one part 48% HF to two parts concentrated $HNO_3$). Place the cleaned wafer in a new, clean, graphite crucible, put the crucible with the wafer into a furnace and heat at a temperature of 520° C. for two minutes in flowing hydrogen. Cool to room temperature and remove the wafer from the furnace, and check its conductivity type, as with a thermal probe. If the wafer is N-type, return the wafer to the furnace and repeat the foregoing annealing step. Repeat the checking and annealing until the wafer is slightly P-type, or until it is essentially intrinsic. When this condition is reached, apply solder dots and lead wires and etch, as described in Example 3.

*Example 5.*—To make a one junction adaptive device, proceed as in Example 3, but apply only one dot to the P-type layer. Etch, as in that example, so that the P-type layer is removed everywhere except under the one dot. Then, apply another dot to the N-type substrate which was exposed by etching and continue as before. The contact to the N-type region will not exhibit adaptive effects.

*Example 6.*—To produce another embodiment of a one junction adaptive device, place a small heap of lithium hydroxide on a 1 ohm-cm. P-type wafer of single crystal germanium 40 mils thick. Place this wafer with the lithium hydroxide upon a clean quartz plate in a resistance furnace of low heat capacity. Heat the wafer at about 500° C. in an atmosphere of flowing dry hydrogen for about 20 seconds and then cool as rapidly as possible. Clean and etch lightly. Attach solder dots to the wafer, one in the region on which the lithium source was placed and one elsewhere on the wafer. Re-etch lightly.

In any of these examples other lithium sources may be used. Such sources should ultimately supply lithium in the form of ions. Examples of such sources are: lithium chloride mixed with powdered calcium metal, lithium hydroxide mixed with salts other than lithium chloride, lithium hydroxide mixed with lithium chloride in other than the proportions stated in the examples, lithium suspended in a carrier oil, lithium evaporated on the surface of the semiconductor. In some of these cases and others not mentioned appropriate variations in the initial procedure of introducing the ions into the semiconductor will be required.

A novel information processing system including adaption networks and circuits embodying adaptive semiconductor devices of the type described above is shown in FIGURE 5, and circuits are described in detail hereinafter. The system includes an input equipment 100 which translates information into a form suitable for processing in the system. The input equipment 100 may include transducers or sensors which translate physical effects, such as light, heat, temperature, speed, and acceleration and the like into electrical signals. The input equipment 100 may include an encoder for translating analog signals into digital signals. The signals which are provided by the input equipment may be either in serial or in parallel form. These signals are simultaneously applied to adaption networks 102 and to an error signal processing system 104. The adaption networks 102 include adaption circuits 106 and adaptive device control circuits 108 which control the adaption circuits 106. The adaption circuits 106 are part of the data processing equipment 110, and are shown separately to better illustrate the invention.

The data processing equipment may be the circuits and amplifiers of the type used in an analog computer, if the signals provided by the input equipment 100 are in analog form. The data processing equipment 110 may include digital arithmetic and memory equipment in the event that the input equipment 100 provides information in digital form. The adaption circuits 106 may function either as rectifying, resistive or amplifying circuits in the data processing equipment. For example, by changing the characteristics of the adaptive devices in these adaptive circuits 106 from rectifying the resistive characteristics, the data processing equipment can be adapted to perform various functions such as different logic operations.

The output data from the data processing equipment is applied to the output equipment 112 which may be a printer or other display device. The data processing equipment 110 may also include error detection equipment 114 such as circuits which detect signals above a certain threshold, parity check circuits, and the like. The error detection equipment 114 feeds error signals to the error signal processing system 104 and to the adaptive device control circuits 108. The error signal processing system 104 provides information in the form of electrical signals or radiant energy signals (as indicated by the dashed line) for directly operating upon the adaptive devices in the adaption circuits 106. The adaptive device control circuits 108 may also be operated by feedback signals from the adaptive devices themselves and by the input signals from the input equipment 100.

Adaption to different types of information carried under different signal conditions may be accomplished in the adaption networks 102 in any one or all of three ways: (1) By changing the ambient conditions in the vicinity of any selected one or more of the adaptive devices in the circuits 106, as by application of radiation (either light or other radiant energy) or by connecting heat sources or heat sinks to the devices; (2) by changing the electrical signal levels in circuits which are connected to the devices, but which connected circuits do not handle information signals; and (3) by changing in the level (for example, the direct current level) of the signals applied to the system from the input equipment.

An example of adaption of a device by changing the level of signals passing through a device is illustrated in FIGURE 1. The circuit itself provides and applies to the device a rectified output voltage polarized to switch the device from its rectifying state to its low resistance state. It should be noted that the circuit of FIGURE 1 may be considered a bistable memory element, since the device stores an information bit represented by signals of one polarity or of opposite polarity, respectively, by becoming and remaining either resistive or rectifying.

Signals which are applied from the input equipment 100 to the adaptive device control circuits 108 and signals fed back (a) from the circuits 106 themselves, (b) from the error signal processing system 104, or (c) from the error detection equipment in the data processing equipment 110 can adapt the devices in the adaption circuits 106 to provide different characteristics under different signal conditions. Thus, the information processing system characteristics may be altered by adaption of the type indicated in the first category listed above.

One manner in which the adaptive devices in the circuits 106 may operate in response to inputs from the error signal processing system 104 may be to adapt them from their resistive to rectifying states, when a particular sequence of successive errors is detected. The adaptive devices in the circuits 106 may block the operation of all or part of the data processing equipment in which the errors appear. When the error causing defect in the data processing equipment 110 is cleared, or when proper input signals are provided by the input equipment 100, the devices in the adaption circuits 106 may be reset by re-adapting them to their resistive states by suitable inputs thereto from the error signal processing system 104.

One generally useful type of adaption circuit is shown in FIGURE 6. This circuit includes an adaptive semiconductive device 120 having input and output connections thereto. The device 120 is illustrated symbolically as a box having a darkened triangle at one end thereof. The darkened triangle represents one side of the P-N junction of the device. The direction in which the apex of the triangle points indicates the direction of easy current flow through the device when it is in its rectifying state, viz., the forward direction of current flow through the device. The symbol for the device 120 also includes suitable means for providing a desired temperature in the device such as indicated by the dotted rectangle 65 (FIGURE 1). A multi-junction device may be illustrated by a block having a plurality of darkened triangles to indicate several different junctions.

The control circuit 122 for the device is a biasing circuit including a source of direct current voltage, shown as a battery 124. A current limiting resistor 126 is connected in series with the battery 124. The battery 124 and the resistor 126 are connected through a double pole switch 128 to the output of the control circuit 122. The switch 128 may have three positions. In one (shown in the drawing), the biasing circuit is disconnected from the adaptive device 120. In another position of the switch 128, voltage in the forward direction is applied across the device 120 and the current may pass through the device 120 in the forward direction. This forward current is designated by the arrow and is labeled with the legend $I_f$. In still another position of the switch 128, a voltage in the back or reverse direction is applied across the device 120 and a back current indicated by the arrow and the legend $I_b$ may be passed through the device 120.

Assuming that the device 120 is in a rectifying state and acts as a diode, voltage in the back direction may be applied across the device in order to cause back current $I_b$ to flow therethrough to change the device 120 from its rectifying state to its resistive state. By applying different magnitudes of the back voltage or by passing the back current $I_b$ through the device for different periods of time, the adaptive device may be adapted to provide different values of resistance. The adaptive device 120 may be reset (or readapted) by passing a forward current $I_f$ through the adaptive device 120 for a predetermined period of time.

Although the control circuit 122 is illustrated as a biasing circuit, it will be appreciated that signal currents, for example, generated in the error signal processing system 104 (FIGURE 5), may be used for the same purpose by selectively applying reverse or forward voltages across the adaptive device 120. Thus, the adaptive device 120 may be set in a particular resistive state so as to present a selected value of resistance in the data processing equipment 110 (FIGURE 5). The system signals may also be used to reset the adaptive device 120 and make it rectifying, when desired. The circuit shown in FIGURE 6 therefore may selectively provide a bistable conductive characteristic and a signal-controlled variable resistance.

FIGURE 7 shows an adaption circuit including an adaptive device 130 of the invention which may be adapted by a process dependent on the presence of radiant energy. The circuit includes an adaptive device 130 which may be similar to the device shown in FIGURE 6. The radiant energy is visible light generated by an incandescent lamp 132. Other sources of radiant energy, such as electroluminescent elements, heater elements, and the like, may be used. Also, other frequency bands, such as infrared, ultraviolet, gamma rays, etc., to which the particular adaptive device is sensitive may be used. For improved efficiency, an optical lens 134 is used to focus the radiation on the junction area of the adaptive device 130. A biasing circuit 136 similar to the biasing circuit 122 may be used to selectively bias the adaptive device 130 in the forward or the reverse directions.

When the network of FIGURE 7 is used as a light intensity storage element, the adaptive device 130 is brought to the desired temperature and then illuminated concurrently with the application of reverse bias thereto. The reverse bias alone is not of sufficient magnitude to initiate switching of the device from its rectifying state to its resistive state. The presence of the illumination, even momentarily, triggers the adaption process in the adaptive device 130. So long as the biasing current $I_b$ is applied, the adaptive device, once triggered, undergoes adaption and can switch from its rectifying state to its resistive state or to any inermediate resistive sate. The value of resistance presented by the adaptive device 130, after the biasing current ceases, depends upon the period of application of that current. The adaptive device 130 may be reset to a more rectifying state by passing forward current $I_f$ therethrough, by means of the biasing circuit 136. Circuits, such as shown in FIGURE 7, may be used in a matrix array as a part of a pattern recognition system, as will be described hereinafter in connection with FIGURE 12 of the drawings. The circuits may also be used in the adaption networks 102 (FIGURE 5).

A circuit of the type shown in FIGURE 7 may be used as a transducer for deriving an electrical signal indicative of an ambient temperature above some threshold value. For example the device 130 may be connected in an alarm circuit. If the temperature in the vicinity of the adaptive device 130 increases to a value above some threshold value, the adaptive device 130 switches from a rectifying state to a more resistive state. Current then passes through the adaptive device and may be used to operate an alarm.

The adaptive circuit 140 shown in FIGURE 8 is designed to handle information in the form of alternating current signals. The circuit 140 includes an adaptive device 142 of the type described above. The device 142 may be made in accordance with Example 5 of the foregoing examples (see above). A biasing circuit 144 is shown as being illustrative of the type of circuit which may be used to send either forward or reverse adaption currents through the adaptive device 142. Alternating current or pulse input signals are applied to input terminals 146 of the circuit 140. One of the terminals 146 is connected to the adaptive device 142 through a capacitor 148. The capacitor 148 has a sufficiently large value of capacitance to present a relatively small impedance to the passage of alternating current therethrough. The capacitor 148 blocks the flow of direct current and effectively presents a relatively high impedance to the passage of direct current. Thus, when the adaptive device 142 is in its rectifying state, a direct current voltage is obtainable across the capacitor 148. Application of reverse bias from the biasing circuit 144 converts the adaptive device 142 to a more resistive element. Then, alternating current flows through the capacitor so that substantially no direct current output voltage is obtainable across the capacitor 148. By applying adaption currents in the forward and reverse direction the circuit 140 may be adapted selectively to store either a binary "1" or a binary "0" bit. Storage of a bit of one value, e.g., a binary "1," is represented by the presence of a direct current output voltage across the capacitor 148. An array of circuits, such as the circuit 140, may be used as a binary data memory.

The biasing circuit 144 may be connected to the adaptive device 142 through a switch 150. The biasing circuit 144 is also shunted by a storage capacitor 152. The biasing circuit 144 may charge the capacitor 152 and then be disconnected therefrom. When the switch 150 is closed, the storage capacitor 152 discharges through the device 142 and provides adaption currents either in the forward or reverse direction. The switch 150 may be relay contacts, a binary gate circuit, or other electronic switching device. By selectively discharging the storage capacitor 152 through different resistors 153 in series with the charging capacitor 152, a discharge current may be varied so as to adapt the device 142 to a desired rectifying or resistive characteristic in the device 142. The circuit 140 may then present a nonlinear (e.g., square law) impedance useful for signal detection and other purposes.

The adaption network 160 in FIGURE 9 includes a two-junction adaptive device 162 such as is illustrated in FIGURE 3. The two junctions are represented by the letters A and B. A control or biasing circuit 164, similar to the circuit 122 (FIGURE 6), is connected across the device 162. An alternating current signal source may be connected to input terminals 166 of the network 160. An output resistor 168 is connected in series with the device 162.

As explained above in connection with FIGURES 3 and 4, the adaptive device 162 may be set in any one of a family of states characterized by the I-V characteristic. Consider, for purposes of explanation the three different states, namely, (a) where junction A is rectifying in one direction and junction B is resistive; (b) where junction B is rectifying in the other direction and junction A is resistive, and (c) where both junctions A and B are resistive. The adaptive device 162 may be set into any one of these three states by appropriate biasing currents derived from the biasing circuit 164 in accord with the methods described above for single junction devices. When the adaptive device 162 is rectifying in one direction as in state (a), the net work 150 provides half-wave rectification of the alternating current applied to the input terminals 166. Pulses of output voltage, which are positive with respect to ground, appear across the resistor 168. When the adaptive device 162 is set to rectify in the other and opposite direction as in state (b), negative pulses (with respect to ground) of output voltage appear across the resistor 168. When the adaptive device 162 is resistive as in state (c), the alternating current input signal appears across the resistor 168 with attenuation which depends upon the resistive characteristics presented by the device 162. These positive or negative pulses may represent binary "1" or binary "0" bits, respectively.

In the data processing equipment 110 (FIGURE 5), the adaptive network 160 may be used in the network 102 (FIGURE 5) for adapting the system to handle bits which may be incorrect by inverting the polarity of signals representing these incorrect bits and thereby correcting these bits.

FIGURE 10 shows an adaptive circuit 170 wherein the signal path for adaptation currents is different from the signal path for signal currents. The circuit 170 includes an adaptive device 172 having a pair of adaptive junctions, for example, by providing P-type layers on opposite sides of an N-type substrate in accordance with the foregoing examples. In addition, an ohmic connection 174 is made to the substrate. Adaption currents may be provided by means of a biasing circuit 176 or other signal actuated network. The adaptive device 172 may normally have both of its junctions in their rectifying states. When reverse bias is applied across one junction of the adaptive device 172, that junction may be rendered resistive. Continued passage of reverse current through that junction causes heating of a portion of a device. The heat generated is transmitted through the material of the substrate to the junction which is connected to the output of the device thus changing the state of that junction from its rectifying to its resistive state. In this mode of operation, the means 65 is used to control the dissipation of heat from the adaptive device 172. The application of reverse bias by the biasing circuit 176 therefore changes the characteristics of the output junction of the device. The device 172 may be made in accordance with known transistor technology whereby the junction connected to the output may be a P-N junction of the type used in commercial transistors. In the latter case, a relatively heavy current may be carried by the output circuit without causing the further adaption or change in state of the junction connected to the output circuit.

Figure 11:
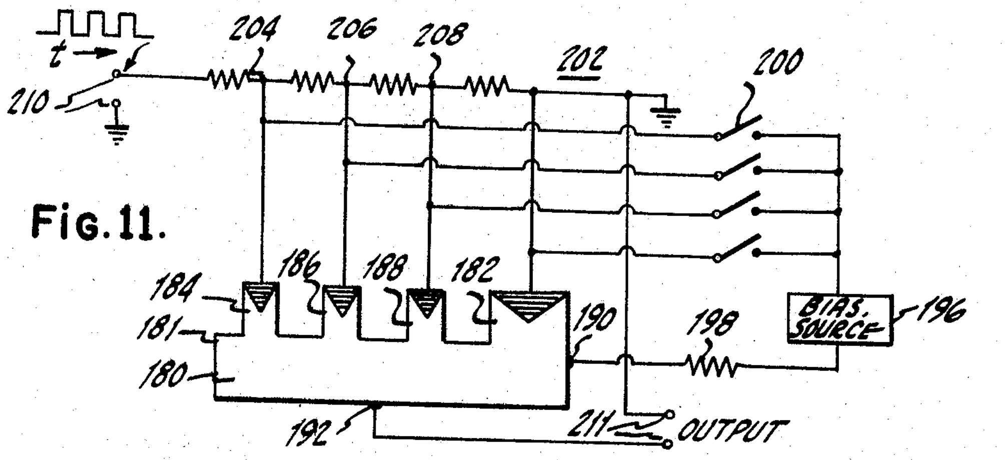

FIGURE 11 illustrates an adaptive circuit including an adaptive device 180 having a plurality of adaptive junctions. A wafer 181 in which a P-N adaptive junction is formed may be etched below the junction region and well into the wafer leaving a plurality of independent junctions. One of these junctions 182 may be made more massive than the remaining three junctions 184, 186 and 188. The junction 182 has characteristics different from the other junctions. Ohmic connections 190 and 192 may be made to an end and to the base of the wafer 181, respectively.

A circuit for adapting the device to selectively switch the junctions from their rectifying to their resistive states includes a biasing source 196 connected through a resistor 198 to the end connection 190. The biasing source 196 is connected through each of the different junctions 182, 184, 186 and 188. An output resistor 202 having three taps 204, 206 and 208 is connected between a pair of input terminals 210. Input signals to the network, for example, a train of pulses, may be applied between the terminals 210. The taps 204, 206 and 208 are connected to the junctions 184, 186 and 188. The massive junction 182 is connected to the terminal end of the resistor 202. The output is obtained between a pair of terminals 211 connected to the base connection 192 of the wafer 181 and one of the input terminals 210.

The input signals may be selectively attenuated to different signal levels by selectively switching the junctions 182, 184, 186 and 188 from their rectifying to their low resistive states.

When one of the junctions, for example, the junction 186, is switched to its low resistance state, the tap 206 on the resistor 202 is connected through the junction 186 to the base connected output terminal 211. The magnitude of the output signal can be changed in steps by switching the junctions 184, 186, 188 and 182 into their low resistive states.

Time delays in the attenuation are introduced since one of the junction sections of the device 180, namely, the junction 182, is formed in a more massive part of the device 180 than the other junctions 184, 186 and 188. The junction 182 therefore is slower to heat and takes a longer time to switch to its resistive state than do the other junctions 184, 186 and 188.

Although only four junctions are shown in FIGURE 11, it will be appreciated that many junctions interconnected in various ways may be formed in a single wafer of semiconductor material to provide an integrated device including rectifying and resistive elements. Such a device may be used, for example, as a decoder matrix. Such a matrix may be made to operate in accordance with different codes, for example, by converting from one to any of a number of different codes by selectively adapting different ones of the junctions. Accordingly, a single integrated circuit having adaptive junctions may perform the function of a plurality of diode matrices.

A pattern recognizing device may be provided by a matrix of adaptive devices disposed in a planar array 220 as shown in FIGURE 12. Nine adaptive devices 222 are provided. It may be preferable to use a much larger number of devices, the drawings only showing nine to facilitate the understanding of the invention. The devices in one row of the array are connected in parallel to a biasing circuit 224. The remaining devices are connected in parallel to another biasing circuit 226. A mask 229 having an opening 233 which forms the pattern to be recognized is located between a source of illumination, such as a lamp 228, and the matrix 220. The pattern illustrated is the letter A. The matrix 220 is adapted or trained to recognize the letter A by flashing a light image of that letter thereon. Some of the adaptive devices 220 have light incident thereon, while others are not illuminated. Each of the devices which is illuminated is switched from its rectifying state to its resistive state, as was explained above in connection with FIGURE 7. Since the devices 222 remain in their resistive state when switched, the letter A is stored in the device matrix 220. The connection of the two biasing circuits 224 and 226 (FIGURE 12) make the matrix more responsive or less responsive to certain features of a pattern, such as straight lines, edges, corners, etc. In other words, the matrix 220 is particularly responsive to certain features of a pattern.

This feature abstraction process is accomplished by lowering the threshold of adaptation (switching from rectifying state to the low resistive state) in selected groups of the semiconductor devices 222 in matrix 220. For example, the two biasing circuits 224 and 226 may have the same maximum current supply capacity. Since the bias circuit 226 supplies current to more devices than biasing circuit 224, less current flows through the devices supplied by the biasing circuit 226 than through the devices supplied by the other biasing circuit 224. The threshold of adaption of the devices connected to the biasing circuit 226 is therefore higher than the threshold of adaption of the other devices 222 connected to the biasing circuits 224. The matrix 220 may be more responsive to vertical edges of the pattern on the left side thereof, than to edges, corners, and the like. Other means, such as thermally conductive members, for example copper blocks, may be disposed in the matrix between different ones of the devices 222. Heat coupling may be provided which lowers the threshold of adaption of some devices to their low resistance state. Such thermal coupling may also provide for abstraction of certain features of a pattern.

The system of FIGURE 13 interrogates or reads out the matrix 220 of adaptive devices in a non-destructive manner, that is, the state of the devices 222 in the matrix 220 is not changed during read-out. It is assumed that the matrix 220 has been exposed to a light pattern, as explained above with reference to FIGURE 12, and has learned to recognize that pattern. The letter A, for example, may be the pattern which the matrix 220 has learned to recognize. The matrix 220 is connected to another matrix 230 including an array of photoconductive cells 232 which have a similar arrangement to the arrangement of adaptive devices 222 in the matrix 220. The cells 232 are of the type which have a high resistance when not exposed to light and a low resistance when exposed to light. Cadmium sulphide cells may be suitable. Each of the cells 232 and each of the devices 222 are connected to a separate output resistor 234. A source of read-out signals, for example, a source which provides a pulse of current of negative polarity with respect to ground is connected across each cell 232 and its output resistor 234 and across each adaptive device 222 and its output resistor 234. The output resistors are connected to a binary comparator 242 which may include a plurality of relay circuits which respond to coincidence and anti-coincidence of output signals across the output resistors of correspondingly positioned photocells 232 and adaptive devices 222, when the read-out pulse is applied. For example, the comparator includes a pair of relays 238 and 240 which are connected to the output resistors of the adaptive device and the photoconductive cell in the upper left-hand corner of the matrices 220 and 230. When both of these relays 238 and 240 are energized or when both of these relays are de-energized, a current path is provided between the movable contacts of these relays. However, if one of the relays is energized but the other is not energized, the current path is broken. A similar relay circuit is provided for each correspondingly positioned path of an adaptive device and a photoconductive cell in the matrices 220 and 230. Accordingly, a circuit is completed from a source of operating voltage indicated as a battery 244 through the contacts of the relays in the comparator 242 and through an output resistor 246.

Since the adaptive device matrix was exposed to the pattern, some of the devices 222 therein are in their low resistance state and some are in their rectifying or high resistance states.

The unknown pattern is imaged on the photoconductive cell matrix 230. Thus, some of the cells 232 assume a lower resistance than others, depending upon the nature of the unkown pattern. When a read-out pulse is applied, while the cells 232 are exposed to the unknown patterns, only those output resistors 234 which are connected to adaptive devices 222 or photoconductive cells 232 which are in their low resistance states pass sufficient current to develop voltage drops across their output resistors 234 which are of high enough magnitude to operate the relays 238 and 240. When the pattern stored in the adaptive device matrix 220 corresponds to the pattern imaged on the photoconductive device matrix 230 a complete circuit path will be provided through the comparator and an output voltage appears across the output resistor 246 indicating that the unknown pattern corresponds to the pattern which the adaptive device matrix has learned to recognize. When the unknown pattern does not match the pattern stored in the adaptive device matrix 220, the comparator does not provide a complete circuit path and no output signal is available across the output resistor 246.

When only coincidence between the stored light pattern and the unknown light pattern is to be detected, the photoconductive cells may be connected in series with correspondingly positioned adaptive devices and their output resistors 234. An output will be provided across the output resistor 234 when both the cell 232 and is corresponding adaptive device 222 are in their low resistance states. The photoconductive cell 232 and adaptive devices 222 may be constructed as a unitary or integrated structure in accordance with known semiconductor device manufacturing techniques.

Neuron circuits and networks (circuits which simulate biological neurons and nerve networks) may also make use of the present invention. FIGURE 14 shows a neuron circuit 250 having three inputs and a pair of outputs. One of these outputs is an excitatory output while the other is an inhibitory output. Weighting networks 252, 254 and 256 which may be of the type shown in FIGURE 15 are connected to the inputs of neuron circuits.

A neuron circuit is a device which simulates the behavior of the biological nerve cell. The neuron circuit responds to inputs which are either excitatory or inhibitory. When the sum of the excitatory input signals (which may be positive voltage levels) exceeds the sum of the inhibitory input signals (which may be negative voltage levels) and a predetermined threshold, the neuron circuit is triggered and provides a train of output signals which is a function of the input signal magnitudes. The excitatory output may be positive with respect to the inhibitory output.

Control over the neuron circuits may be effected by controlling the magnitudes of the input signals by means of the weighting networks 252, 254, 256 which may present different resistances and selectively attenuate the input signals. By adjusting the weighting presented by the networks 252, 254, and 256 selectively with respect to previous or known phenomena, the neuron circuit 250 may be made to learn to respond to such known phenomena.

The weighting network shown in FIGURE 15 is exemplary of the networks 252, 254 and 256 (FIGURE 14) and includes an adaptive device 260 of the type having a pair of adaptive junctions, each on an opposite end of a body of semiconductor material. An ohmic contact 262 is made to the body of the semiconductive material. The device 260 may be similar to the device 272 shown in FIGURE 9. A biasing circuit 264, representative of any signal controlled circuit which provides adaption signals to the network, is connected between ground and a pair of switches 266 and 268. The switch 266 connects the biasing circuit 264 to one of the junction ends of the device 260. The switch 268 connects the biasing circuit 264 to the opposite end of the device 260. By selectively closing either or both of the switches 266 and 268, voltages which bias the adaptive junctions of the device 260 in the reverse direction may be selectively applied to either or both of the junctions. Thus, the device 260 may selectively be made rectifying in either a forward or reverse direction, and also may be made to present selected values of resistance between the input terminal 261 and the output terminal 263 of the network.

The circuit has three different states of operation. If alternating current signals are applied to the input terminal 261, the device may be adapted either to attenuate these signals, or rectify the signals and provide either positive or negative voltage levels at the output terminal 263. When the networks like that of FIGURE 15 provide the weighting networks 252, 254, and 256 (FIGURE 14), they may be adapted so as to provide either excitatory (positive) or inhibitory (negative) input signals to the neuron circuit 250. Moreover, the weight or the relative amplitude of the signals, whether excitatory or inhibitory, may be established by adapting the states of the junctions of the device 260 to present the proper value of resistance to the signal which passes through the device 260.

Neuron devices, such as the device 250, are described in the Proceedings of the National Electronics Conference, vol. 17, Oct. 9 to 11, 1961, page 302, et seq.

FIGURE 16 illustrates an adaptive amplifier circuit 270 including an adaptive device 272 which has two junctions marked C and E to which connections are made. Junctions C is larger than junction E. The device exhibits transistor-like action in that charge carriers emitted from the smaller emitter junction E can be collected at the larger, collector junction C when appropriate operating voltages are applied to the device. The device 272 also has an ohmic connection to the substrate or base on which the junctions C and E are formed.

The circuit includes an input resistor 274 connected between the base and emitter and an output resistor 276 connected through a source of operating voltage, shown as a battery 278 to the emitter, and to the collector. Input signals may be applied across the input resistor 274. Amplified output signals corresponding to the input signals are obtained across the output resistor 276.

Adaption signals may be applied from adaption signal sources to change the gain of the device. These adaption signal sources are shown illustratively as biasing circuits 280 and 282, similar to circuit 122 (FIGURE 6). These circuits 280 and 282 are connected, respectively, from base to emitter and from base to collector of the adapted device 272. When the amplifier is to be adapted, voltages across the junctions in the bad direction are applied from the biasing circuits 280 and 282, either individually or together, to degrade or increase the rectifying action of either or both of the junctions. After the device 272 is adapted, signals may be applied to the amplifier 270.

From the foregoing description, it will be apparent that there have been provided improved adaptive devices, methods for making same, and systems, networks and circuits for using these devices. Other methods of making the adaptive devices, variations in the adaptive devices themselves and in the systems, networks and circuits embodying these devices will, undoubtedly, become apparent to those skilled in the art. Accordingly, the foregoing description should be taken merely as illustrative and not in any limiting sense.

What is claimed is:

1. An adaption circuit comprising
(a) an adaptive semiconductor device having resistive and rectifying states,
(b) output means including an impedance element connected in series with said device,
(c) means for connecting said series connected device and element to a source of alternating curent, and
(d) adaption means associated with said device for selectively setting said device in its rectifying and resistive states.

2. A bistable circuit for storing a binary bit of information comprising
(a) an adaptive semiconductor device having resistive and rectifying states, (b) a capacitor connected in series with said device,
(c) input means for connecting an alternating current source in series with said device and said capacitor, and
(d) means for setting said device in different ones of its said states for respectively storing the "1" and "0" values of said bit.

3. An adaption circuit comprising
(a) an adaptive device having two oppositely polarized rectifying states and at least one resistive state,
(b) output means including a resistor connected in series with said device,
(c) input means for connecting a source of alternating current to said resistor and to said device, and
(d) adaption means for selectively setting said device in different ones of its rectifying and resistive states to selectively provide output voltages of alternating and of opposite polarity across said resistor.

4. An adaption circuit comprising
(a) an adaptive semiconductor device comprising a body of semiconductor material having a plurality of P-N junctions therein, at least one of said P-N junctions being adaptable to be changed from a rectifying state, wherein said junction operates as a rectifying junction to pass substantially only unidirectional current therethrough, to a resistive state, wherein said junction operates to pass bidirectional current,
(b) adaption means coupled to said one junction for setting said one junction in different ones of its said states, and
(c) output means connected across others of said plurality of junctions.

5. An adaption network comprising
(a) an adaptive semiconductor device including a body of semiconductor material having a plurality of P-N junctions therein, each of said P-N junctions having a plurality of different conductivity states including a rectifying state and a resistive state,
(b) impedance means connected to said junction,
(c) means for applying input signals to said impedance means,
(d) means connected to said device for deriving output signals, and
(e) adaption means connected to said junctions for selectively setting each of said junctions in different ones of their said states.

6. An adaption comprising
(a) an adaptive semiconductor device including a body of semiconductor material having a plurality of junctions therein individually having a plurality of resistive and rectifying states,
(b) means for applying input signals to said device including a resistor having a plurality of taps connected separately to different ones of said junctions on one side thereof,
(c) means for deriving output signals connected to the opposite side of said junctions, and
(d) means for selectively applying adaption voltages across different ones of said junctions for setting said junctions separately in different ones of their said states.

7. An information storage system comprising
(a) a plurality of adaptive semiconductor devices with each having a P-N junction adaptable to being changed from a rectifying state, wherein said junction operates as a rectifying junction to pass substantially only unidirectional current therethrough, to a resistive state, wherein said junction operates to pass bidirectional current therethrough, and vice versa arranged in predetermined relationship with each other, each of said P-N junctions exhibiting one of a plurality of different conductances when operating as a resistive junction, and
(b) means responsive to said information for setting selected ones of said devices in a predetermined state for storing said information.

8. An information storage circuit in accordance with claim 7 that further includes, read out means for applying a signal to said device for reading out the information stored in said devices.

9. An information storage system in accordance with claim 8 that further includes, means for electrically conditioning said devices to switch said P-N junctions from one to the other of their said states when illuminated, and means for selectively illuminating said devices in accordance with a pattern for storing information representing said pattern.

10. A simulated neural network comprising (a) an electrical circuit neuron having an input and an output, said neuron being operative to provide an output when input signals thereto exceed a predetermined threshold level, (b) network connected to said input for transmitting said input signals to said input, (c) said input network including an adaptive semiconductor device, having a plurality of different conductivity states, and (d) adaption means included in said input network for selectively setting said device in different ones of its said states so as to control the effectiveness of said input signals on said neuron.

11. A simulated neural network comprising (a) an electrical circuit neuron having an input and an output, (b) a plurality of weighting networks for individually applying input signals to said neuron including an adaptive semiconductive device having rectifying states and resistive states, and (c) adaption means for selectively setting said devices individually in different ones of said states.

12. The combination comprising, an adaptive semiconductor device having an N-type region and a P-type region with a junction separating said N-type and P-type regions, said semiconductor device being adaptable to be changed from a rectifying state, wherein said junction operates as a rectifying junction to pass substantially only unidirectional current therethrough, to a resistive state, wherein said junction operates to pass bidirectional current therethrough, and vice versa, means coupled to said device for selectively adapting said device to exhibit different ones of said rectifying and resistive states, and means for applying signals to said device.

13. The combination in accordance with claim 12 wherein said means for selectively adapting said device comprises, means for applying adaption current through said device in one or the opposite directions for adapting said device to exhibit a desired one of said rectifying and resistive states.

14. The combination in accordance with claim 12 wherein said means for selectively adapting said device comprises, means for applying radiant energy to said device for adapting said device to exhibit one of said rectifying and resistive states.

15. The combination in accordance with claim 12 wherein said semiconductor device exhibits different values of resistance when operating in said resistive state.

16. The combination in accordance with claim 13 wherein said adaption current is varied to cause said semiconductor device to exhibit different values of resistance when operating in said resistive state.

17. The combination in accordance with claim 13 that further includes, means for initially biasing said device in one direction, and means for applying in a direction opposite to said one direction an adaption current that is greater than said biasing current to adapt said semiconductor device to operate in one of said rectifying and resistive states.

References Cited

UNITED STATES PATENTS 3,165,644 1/1966 Clapper ---------- 340—172.5

OTHER REFERENCES

"Simulating Nerve Networks with Four-Layer Diodes," by A. J. Cote, Jr., pages 51–53, in Electronics magazine, Oct. 13, 1961.

ROBERT C. BAILEY, *Primary Examiner.*

G. SHAW, *Assistant Examiner.*